United States Patent
Yee et al.

(10) Patent No.: US 6,933,537 B2
(45) Date of Patent: Aug. 23, 2005

(54) SEALING FOR OLED DEVICES

(75) Inventors: Low Hong Yee, Singapore (SG); Ewald Guenther, Singapore (SG); Chua Soo Jin, Singapore (SG)

(73) Assignees: Osram Opto Semiconductors GmbH, Regensburg (DE); Institute of Materials Research & Engineering (SG)

( * ) Notice: Subject to any disclaimer, the term of this patent is extended or adjusted under 35 U.S.C. 154(b) by 220 days.

(21) Appl. No.: 09/968,164

(22) Filed: Sep. 28, 2001

(65) Prior Publication Data

US 2003/0062533 A1 Apr. 3, 2003

(51) Int. Cl.⁷ .............................................. H01L 33/00
(52) U.S. Cl. ........................ 257/99; 257/98; 257/100; 257/101; 257/102; 257/97; 438/22; 438/25; 438/26
(58) Field of Search ............................ 257/99, 100, 98, 257/680, 97, 101, 102, 89, 103, 40, 88; 438/22, 25, 26

(56) References Cited

U.S. PATENT DOCUMENTS

| | | | | |
|---|---|---|---|---|
| 5,399,805 A | * | 3/1995 | Tyler et al. | 174/52.4 |
| 5,837,562 A | * | 11/1998 | Cho | 438/51 |
| 5,880,763 A | * | 3/1999 | Tanaka et al. | 347/70 |
| 5,882,761 A | * | 3/1999 | Kawami et al. | 428/69 |
| 5,997,990 A | * | 12/1999 | Kambara et al. | 428/167 |
| 6,335,559 B1 | * | 1/2002 | Charles | 257/620 |
| 6,465,271 B1 | * | 10/2002 | Ko et al. | 438/48 |
| 6,551,724 B2 | * | 4/2003 | Ishii et al. | 428/690 |
| 2002/0030285 A1 | * | 3/2002 | Sawada et al. | 257/782 |

FOREIGN PATENT DOCUMENTS

| | | | | |
|---|---|---|---|---|
| JP | 01161736 | * | 6/1989 | H01L/23/02 |
| JP | 10242315 | * | 9/1998 | G01L/23/04 |
| WO | WO 00/76276 | | 12/2000 | |
| WO | WO 02/21557 | | 3/2002 | |

OTHER PUBLICATIONS

Rogers, C.E., "Permeation of Gases and Vapours in Polymers", 1985, Polymer Permeability, Ed. J. Comyn, Elsvier Applied Science Publishers, Chapter 2, pp. 11–73.

* cited by examiner

*Primary Examiner*—Nathan J. Flynn
*Assistant Examiner*—Fazli Erdem
(74) *Attorney, Agent, or Firm*—Fish & Richardson P.C.

(57) ABSTRACT

Disclosed is a technique for increasing the shelf life of devices, such as OLED which requires hermetic sealing from moisture and oxygen with out increasing the bonding width. In one embodiment, the permeation path of moisture or oxygen is increased without increasing the bonding width. This is achieved by using a grooved interface between the cap and substrate on which the components of the device are formed. The grooved interface can comprise various geometric shapes.

20 Claims, 4 Drawing Sheets

SEALING FOR OLED DEVICES

FIELD OF THE INVENTION

The present invention relates generally to encapsulating or sealing of OLED devices.

BACKGROUND OF THE INVENTION

FIG. 1 shows an OLED device 100 which serve, for example, as a display in various types of consumer electronic products, including cellular phones, cellular smart phones, personal organizers, pagers, advertising panels, touch screen displays, teleconferencing and multimedia products, virtual reality products, and display kiosks.

The OLED device comprises a functional stack formed on a substrate 101. The functional stack comprises of one or more organic functional layers between two conductive layers which serve as electrodes (cathode and anode). The conductive layers are patterned to form rows of cathodes in a first direction and columns of anodes in a second direction. OLED pixels are located where the cathodes and anodes overlap. Charge carriers are injected through the cathodes and anodes via bond pads 150 for recombination in the functional layers. The recombination of the charge carriers causes the functional layer of the pixels to emit visible radiation.

The device is encapsulated with a cap 160, sealing pixels. OLED devices require hermetic sealing since the active components, such as the cathode, are adversely impacted by moisture and oxygen. Typically, an epoxy based adhesive is used to bond the cap to the substrate. However, epoxy based adhesive can be penetrated by oxygen and moisture. The penetration path of the oxygen and moisture is along the interface 180 of the cap and substrate. The length of the penetration path is defined by the bonding width W. The rate of penetration of oxygen and moisture Q depends on the bonding thickness T and W. The rate Q is directly related to the bonding thickness T and inversely related to the bonding width W. Since there is a limit to how much the bonding thickness can be reduced, extending the shelf life of the OLED device is achieved by lengthening the penetration or permeation path which corresponds to increasing the bonding width. Increasing the bonding width undesirably increases the dimension of the device unnecessarily.

As evidenced from the foregoing discussion, it is desirable to provide improved sealing of OLED device without unnecessarily increasing its dimensions.

SUMMARY OF THE INVENTION

The invention relates to improved sealing of devices, particularly those which are require protection from moisture and oxygen such as OLEDs. In one embodiment, the permeation path of oxygen and moisture is increased without increasing the bonding width of the device by providing a geometrically shaped grooved interface between the cap and substrate. The grooved interface can comprise various shapes, such as a triangular, rectangular, spherical, or a combination thereof.

PREFERRED EMBODIMENTS OF THE INVENTION

Figure 1:
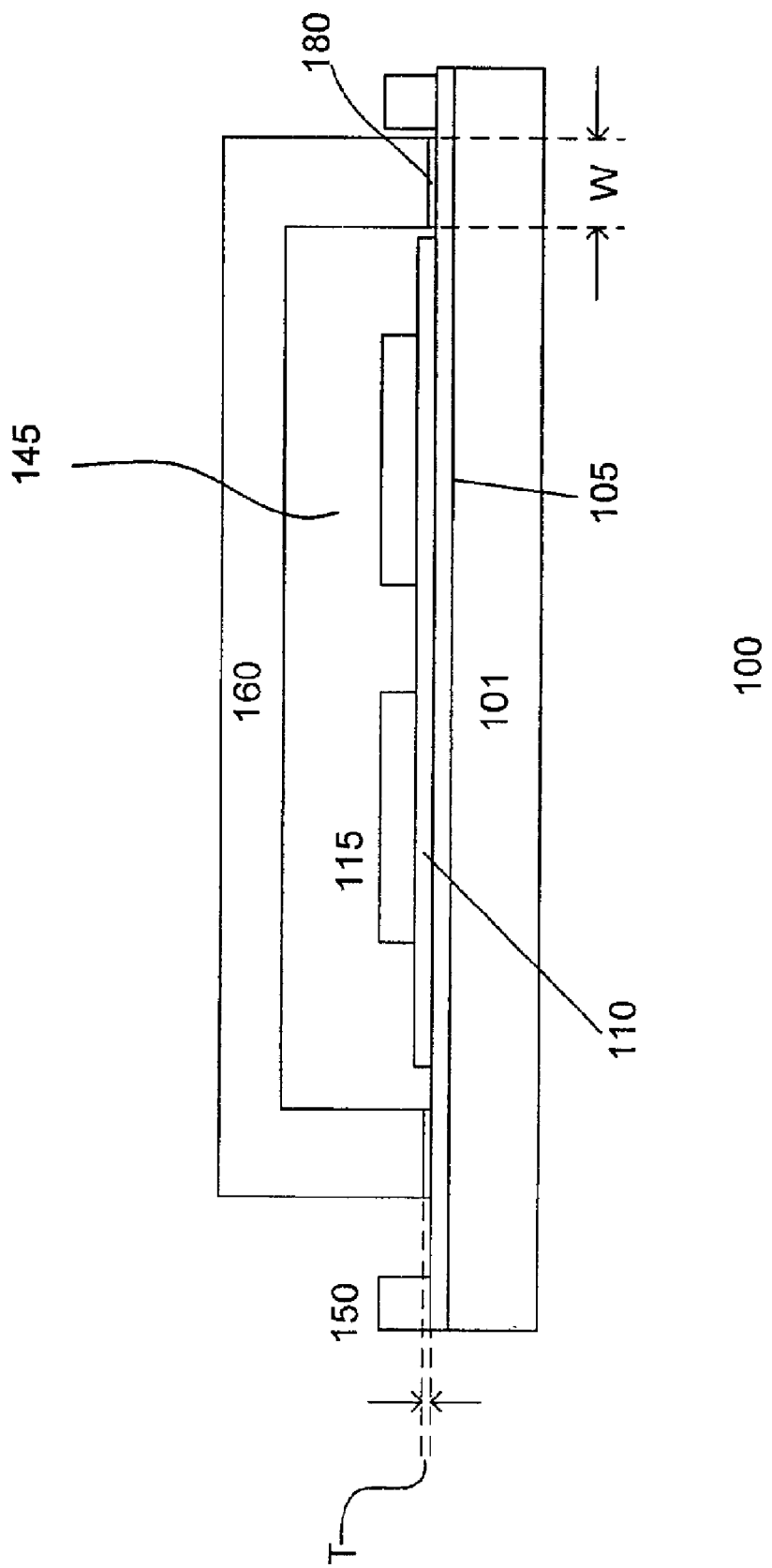
FIG. 1 shows a conventional OLED device.
Figure 2:
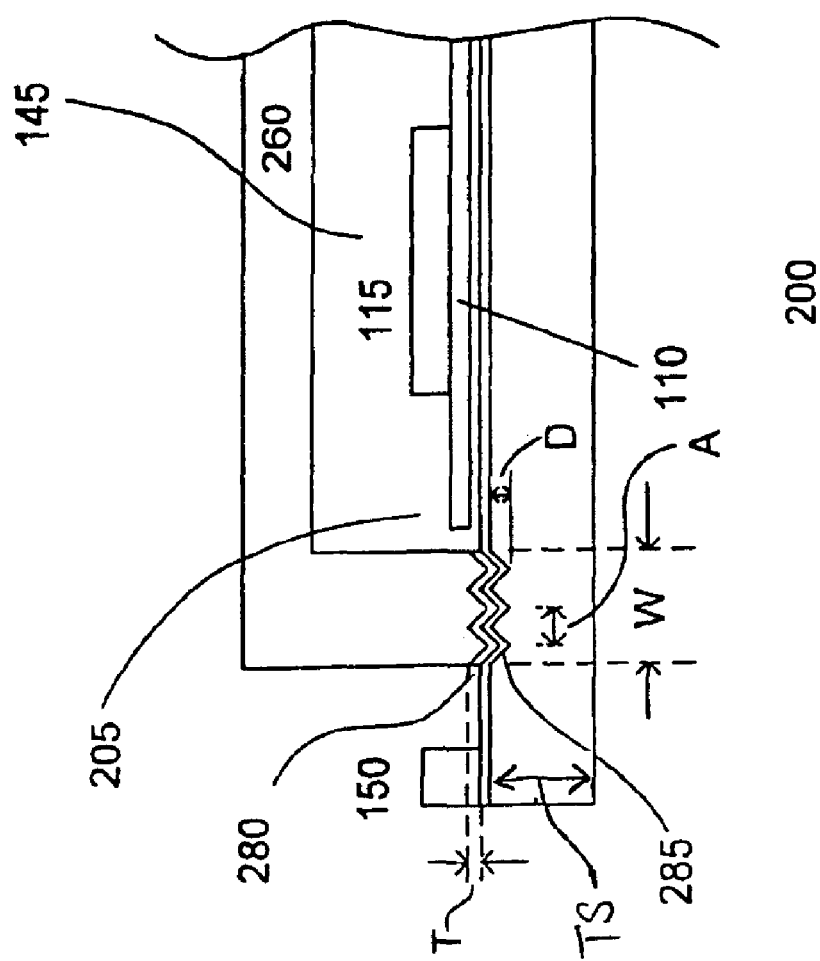
FIG. 2 shows an OLED device in accordance with one embodiments of the invention.

FIG. 2 shows a portion of an OLED device 200 in accordance with one embodiment of the invention. As shown, the OLED device comprises active components in the active region 205 of a substrate 201. In one embodiment, the substrate comprises a transparent substrate, such as glass. Other types of transparent materials that can serve as a substrate to support the OLED active components are also useful. Non-transparent substrates can also be used, for example, with applications in which radiation is visible through a cap 260.

The active components typically comprise one or more organic layers 110 sandwiched between first and second electrodes 105 and 115. The electrodes can be patterned to form pixelated, segmented, or other types of devices. In one embodiment, the first electrode(s) 105 are anode(s) and the second electrode(s) 115 are cathode(s). Forming first electrodes that are cathodes and second electrodes that are anodes is also useful. Bond pads or electrical contacts 150 are electrically coupled to the cathodes and anodes.

In accordance with the invention, an interface 280 of a cap 260 and the substrate comprises a geometric shape formed by one or more grooves 285. Preferably, the interface is formed using less than or equal to 5 grooves. Providing a geometrically shaped interface between the cap and substrate effectively increases the permeation path, or effective bonding width EW, for oxygen and moisture without increasing the actual bonding width W of the cap or dimensions of the OLED device.

In one embodiment, the geometric shape comprises a triangular shape. Using a triangular shape having sides of length C, the effective width of each geometric shape is equal to 2C while the actual width of each geometric shape is equal to A, where A<2C. Thus using the geometrically shaped grooves, the permeation path or effective bonding width EW can be lengthened without lengthening the actual bonding width W.

As shown in Table 1, results of theoretical calculations based on the equation 1 below has shown that the present invention resulted in increased shelf life without increasing the actual bonding width W. The calculations in table 1 are based on the assumption that the grooves are triangular with depth D equal to 0.5 mm.

$$Q = \{P \times AR \times SL \times \delta p\}/T \quad \text{(Equation 1)}$$

where:

Q = the amount of water penetration;

AR = cross section of the exposed area (bonding thickness T×W, where W=to effective bonding width or length of permeation path);

T = Bonding thickness

P = the permeability of water vapor transmission rate (0.75 gmm/m².day for epoxy);

SL = the shelf life;

$\delta p$ = the partial pressure (assuming a constant)

TABLE 1

| Effective Permeation Path Width (mm) | Bonding Thickness (mm) | Number of Grooves | Actual Bonding Width (mm) | Improvement |
|---|---|---|---|---|
| 35 | 0.5 | 35 | 7 | 5 |
| 25 | 0.36 | 25 | 5 | 5 |

TABLE 1-continued

| Effective Permeation Path Width (mm) | Bonding Thickness (mm) | Number of Grooves | Actual Bonding Width (mm) | Improvement |
|---|---|---|---|---|
| 20 | 0.28 | 20 | 4 | 5 |
| 15 | 0.21 | 15 | 3 | 5 |
| 3 | 0.04 | 3 | 0.6 | 5 |

For example, assume the bonding thickness T is 0.21 mm and a 15 mm permeation path is necessary to achieve desired shelf life. As indicated in Table 1, using 15 grooves, the desired shelf life can be achieved with an actual bonding width W of only 3 mm. Thus, the present invention enables a reduction of the actual bond width W by about 5 times.

Figure 5:
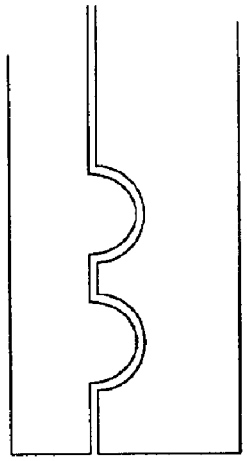
FIGS. 3–5 show various geometric shaped bonding interfaces in accordance with different embodiments of the invention.
Figure 3:
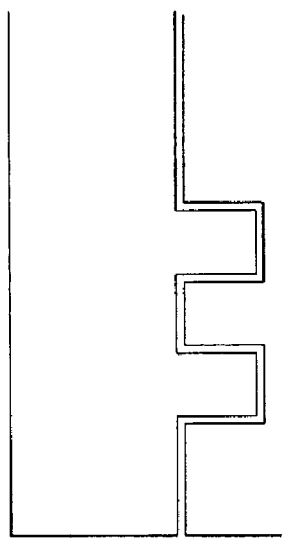
Figure 4:
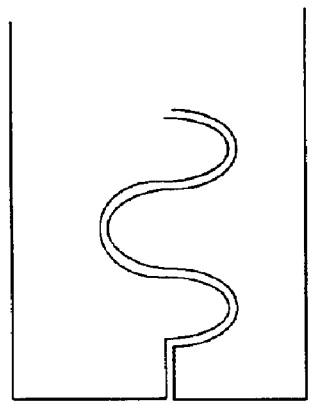

Other geometric shapes can also be used to create the interface between the substrate and cap. For example, as illustrated by FIGS. 3–5, the interface can have a rectangular, an elliptical, or a spherical shape. A combination of different geometric shapes can also be employed.

The depth D of the groove should not adversely affect the structural integrity of the substrate. In one embodiment, the depth D is less than the thickness of the substrate TS and more preferably D is less than ½ TS. For example, the depth D of a groove is about 0.5 mm for a 1.1 mm thick substrate. If triangular grooves are used, the width A of a triangular groove is about 0.2 mm and the length of the sides C is about 0.509 mm. This produces a permeation path or effective width EW of 1.1 mm with an actual width W of only 2 mm, which is about a five-fold increase over non-grooved interfaces. For rectangular grooves, the male groove is about 0.15 mm in width while the female groove is about 0.2 mm wide.

As discussed previously, the bonding thickness T impacts the permeability rate of moisture. The smaller the T, the slower the permeability rate. As such, it is desirable to have as small a T as possible. Furthermore, to ensure that that the modulation of the grooves produces an increase in the permeation path, the bonding thickness T is at least smaller than D. In a preferred embodiment, T<<D. In one embodiment, T is less than or equal to 0.14 the actual width A of a groove.

Figure 6:
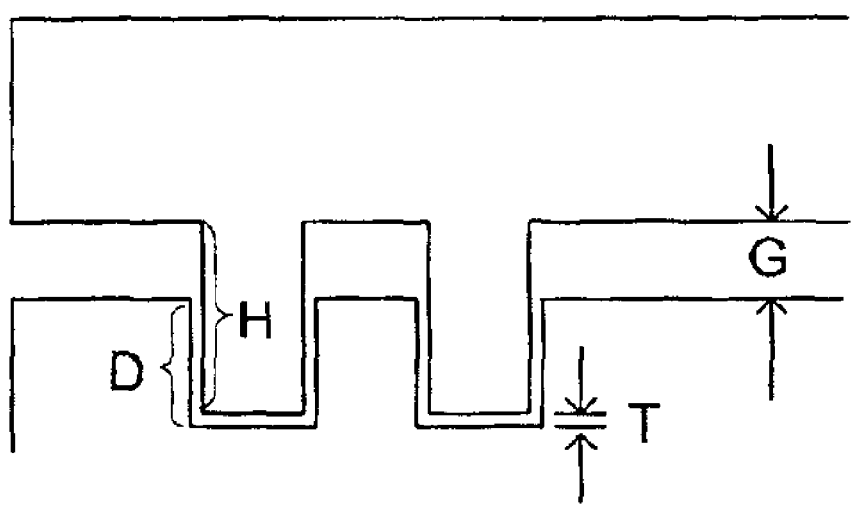
FIG. 6 shows another embodiment of an OLED device.

FIG. 6 shows a portion of a substrate 701 in accordance with one embodiment of the invention. The substrate is processed, for example, to include active components in the active region 205. In one embodiment, the active components comprise OLEDs. The OLEDs can be formed using conventional techniques such as those described in, for example, Sheats, J. R. et al. Organic electroluminescent devices, Science 273, 884–888 (1996), which is herein incorporated by reference for all purposes. At the bonding region 761 of the substrate (region where the cap is bonded to the substrate), at least one groove 285 is provided. In one embodiment, the groove is recessed into the substrate, creating a "female" groove. A cap 760 which is mounted to the substrate is provided to hermetically seal the active components. Where the cap is mounted to the substrate, at least one groove is provided. The groove on the cap protrudes from the cap, forming a male groove. The number of female grooves on the substrate is equal to the number of male grooves on the cap. When the cap is bonded to the substrate, the female and male grooves are fitted together. Providing female grooves on the cap and male grooves on the substrate is also useful. Typically, the cap is bonded to the substrate using conventional adhesives such as epoxy. Other types of adhesive can also be used. Alternatively, for application where the active components or materials used to form the device are not sensitive to heat, soldering or welding can be used to bond the cap and substrate together.

As shown, rectangular geometric shaped grooves are used. Tapered or triangular shaped grooves can be used to, for example, facilitate alignment. Other geometrically shaped grooves or a combination of different geometrically shaped grooves can also be used. In one embodiment, the height H of the male grooves is greater than the depth D of the female grooves to create a cavity 145 in the active region of the device.

The substrate and cap, in one embodiment, comprise glass. Other materials, such as metal, ceramic, plastics, can also be used. It is not necessary that the substrate and cap be formed from the same material. Conventional techniques are used to form the grooves. The technique used, of course, will depend on the material used to form the substrate and cap. For example, conventional glass cutting and/or etching techniques can be used for glass, stamping techniques for metals, and embossing techniques for plastics. Other techniques, such as sandblasting, grinding, drilling, sawing, other mechanical and resist and etching techniques can be employed to form the grooves. Where stamping techniques are used, the substrate can be locally heated to soften the material to facilitate the stamping process.

In an alternative embodiment, a support rim can be formed on a cap. The support rim could, for example, comprise directly or indirectly patternable material. Support rims are described in, for example, International Patent Application titled "Encapsulation of OLED Devices" (attorney docket number 99E5737SG), which is herein incorporated by reference for all purposes. The grooves are formed on the surface of the support rim that contacts the substrate. The grooves, for example, are formed using lithographic techniques using resist and wet etching. Dry etching can also be used. Depending whether the substrate is formed from a more ductile material or not, grooves can be formed in the bonding region of the substrate. Alternatively, the support rim can be formed on the substrate.

For application where either the cap or substrate is more ductile that the other, only the more rigid or harder of the two needs to be grooved. When the cap is mounted with sufficient pressure, the more ductile material will conform to the shape of the grooves. If a barrier layer is needed for the ductile material (e.g., polymeric material), the embossing should be performed before the barrier material is formed thereon. This is because the barrier material is typically brittle and could be damaged by the embossing process.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. An electrical device comprising:
   a substrate having an active region and a bonding region surrounding the active region, the active region comprising active components, wherein the active components include electroluminescent components; and
   a cap having a recess to contain the active region, the cap mounted on the substrate for sealing the active region from the environment, wherein a non-recessed portion of the cap contacts the substrate in the bonding region to form an interface therebetween, wherein the bonding region has a width W, which is defined by the thickness of the cap in the bonding region, wherein:

the interface between the cap and the substrate in the bonding region includes at least one geometrically shaped groove to create an effective bonding width EW that is greater than W, wherein the effective bonding width EW is defined by the length of the shortest path along the interface between the cap and the bonding region;

the at least one geometrically shaped groove includes a first indentation formed in the cap;

the substrate includes a first projection formed in the bonding region, opposite to the first indentation;

the first projection has a shape complimentary to the shape of the first indentation to enable a close fit between the first projection and the first indentation;

the cap and the substrate are comprised of different materials, one material being more ductile than the other;

at least one surface feature is formed from the less ductile material; and the at least one surface feature in the less ductile material deforms the more ductile material and causes the more ductile material to conform to the shape of the at least one surface feature.

2. The electrical device according to claim 1, wherein: a support rim is formed on the cap or the substrate.

3. The electrical device according to claim 2, wherein: the support rim comprises directly or indirectly patternable material; and the support rim includes the at least one geometrically shaped groove.

4. The electrical device according to claim 1, wherein: the at least one geometrically shaped groove includes a second indentation formed in the substrate;

the cap includes a second projection formed in the bonding region, opposite to the second indentation; and the second projection has a shape complementary to the shape of the second indentation to enable a close fit between the second projection and the second indentation.

5. The electrical device according claim 4, wherein: the at least one geometrically shaped groove has a triangular, elliptical, rectangular or circular cross-section.

6. The electrical device according to claim 4, wherein: a support rim is formed on the cap or the substrate.

7. The electrical device according to claim 6, wherein: the support rim comprises directly or indirectly patternable material; and the support rim includes the at least one geometrically shaped groove.

8. The electrical device according claim 1, wherein: the at least one geometrically shaped groove has a triangular, elliptical, rectangular or circular cross-section.

9. The electrical device according to claim 1, wherein: the active components comprise organic electroluminescent components forming an organic light emitting diode.

10. The electrical device according to claim 1, wherein: the substrate comprises a plastic.

11. The electrical device according to claim 1, wherein: the cap is welded or soldered to the substrate.

12. The electrical device according to claim 1, wherein: the cap is bonded to the substrate.

13. The electrical device according to claim 12, wherein: the cap is bonded to the substrate with an epoxy.

14. A process for sealing an electrical device, comprising: forming active components on a substrate, including forming a first electrode, a second electrode, and one or more organic layers, wherein the organic layers are sandwiched between the first and second electrodes;

providing a cap, the cap and the substrate each comprising different materials, one material being more ductile than the other;

forming at least one surface feature in the less ductile material; and mounting the cap with sufficient pressure onto the substrate that the at least one surface feature of the less ductile material causes the more ductile material to conform to the shape of the at least one surface feature, and wherein mounting the cap onto the substrate seals the active components from the environment.

15. The process according to claim 14, further comprising:

forming a support rim on the cap or on the substrate, prior to mounting the cap.

16. The process according to claim 15, wherein the support rim comprises directly or indirectly patternable material, the process further comprising:

forming the at least one surface feature on the surface of the support rim using lithographic techniques.

17. The process according to claim 14, wherein: forming active components on a substrate includes forming organic electroluminescent components.

18. The process according to claim 17, wherein: the at least one surface feature surrounds the active components.

19. The electrical device of claim 1, wherein: the at least one geometrically shaped groove surrounds the active region.

20. An electrical device comprising:

a substrate having an active region and a bonding region surrounding the active region, the active region comprising active components, wherein the active components include electroluminescent components; and a cap having a recess to contain the active region, the cap mounted on the substrate for sealing the active region from the environment, wherein a non-recessed portion of the cap contacts the substrate in the bonding region to form an interface therebetween, wherein the bonding region has a width W, which is defined by the thickness of the cap in the bonding region, wherein:

the interface between the cap and the substrate in the bonding region includes at least one geometrically shaped groove to create an effective bonding width EW that is greater than W, wherein the effective bonding width EW is defined by the length of the shortest path along the interface between the cap and the bonding region;

the at least one geometrically shaped groove includes an indentation formed in the substrate;

the cap includes a projection formed in the bonding region, opposite to the indentation;

the projection has a shape complementary to the shape of the indentation to enable a close fit between the projection and the indentation;

the cap and the substrate are comprised of different materials, one material being more ductile than the other;

at least one surface feature is formed from the less ductile material; and the at least one surface feature in the less ductile material deforms the mere ductile material and causes the more ductile material to conform to the shape of the at least one surface feature.

* * * * *

UNITED STATES PATENT AND TRADEMARK OFFICE
CERTIFICATE OF CORRECTION

PATENT NO. : 6,933,537 B2  Page 1 of 1
APPLICATION NO. : 09/968164
DATED : August 23, 2005
INVENTOR(S) : Hong Yee Low, Ewald Karl Michael Guenther and Soo Jin Chua It is certified that error appears in the above-identified patent and that said Letters Patent is hereby corrected as shown below:

Title page,
Item [56], References Cited, FOREIGN PATENT DOCUMENTS, replace
"JP    10242315    9/1998    G01L/23/04" with
-- JP    10242315    9/1998    H01L/23/04 --.
OTHER PUBLICATIONS, add
-- James R. Sheats, et al., "Organic Electroluminescent Devices", 1996, Science vol. 273, pp. 884-888. --.

Column 5,
Line 46, insert -- to -- before "claim 4".
Line 58, insert -- to -- before "claim 1".

Column 8,
Line 4, replace "mere" with -- more --.

Signed and Sealed this

Twenty-seventh Day of June, 2006

JON W. DUDAS
*Director of the United States Patent and Trademark Office*